(12) United States Patent
Mabuchi et al.

(10) Patent No.: US 9,136,244 B2
(45) Date of Patent: Sep. 15, 2015

(54) SEMICONDUCTOR PACKAGE HAVING A METAL MEMBER AND A RESIN MOLD, WHICH ARE BONDED TO A SILANE COUPLING AGENT AND AN INTERMEDIATE LAYER OF AN OXIDE FILM

(71) Applicant: HITACHI, LTD., Tokyo (JP)

(72) Inventors: Katsumi Mabuchi, Hitachi (JP); Haruo Akahoshi, Hitachi (JP); Shigehisa Motowaki, Mito (JP)

(73) Assignee: Hitachi, Ltd., Tokyo (JP)

( * ) Notice: Subject to any disclaimer, the term of this patent is extended or adjusted under 35 U.S.C. 154(b) by 342 days.

(21) Appl. No.: 13/720,357

(22) Filed: Dec. 19, 2012

(65) Prior Publication Data

US 2013/0161807 A1 Jun. 27, 2013

(30) Foreign Application Priority Data

Dec. 21, 2011 (JP) .................................. 2011-279346

(51) Int. Cl.
*H01L 23/495* (2006.01)
*H01L 23/22* (2006.01)
(Continued)

(52) U.S. Cl.
CPC *H01L 24/80* (2013.01); *H01B 1/00* (2013.01); *H01L 23/3142* (2013.01); *H01L 23/49572* (2013.01); *H01L 23/49582* (2013.01); *H01L 23/49586* (2013.01); *H01L 23/3107* (2013.01); *H01L 23/49562* (2013.01); *H01L 24/32* (2013.01); *H01L 24/48* (2013.01); *H01L 24/73* (2013.01); *H01L 2224/32245* (2013.01); *H01L 2224/48091* (2013.01); *H01L 2224/48247* (2013.01); *H01L 2224/49113* (2013.01);

(Continued)

(58) Field of Classification Search
USPC ......... 257/677, 676, 690, 787, 788, 790, 792, 257/793
See application file for complete search history.

(56) References Cited

U.S. PATENT DOCUMENTS 5,893,723 A * 4/1999 Yamanaka ...................... 438/65
2004/0207056 A1* 10/2004 Seki et al. ...................... 257/676
2012/0058050 A1* 3/2012 Ji et al. ........................... 424/9.1

FOREIGN PATENT DOCUMENTS

JP 56-017048 A 2/1981
JP 05-222544 A1 8/1993
(Continued)

OTHER PUBLICATIONS

Japanese Office Action, Japanese Patent Appln. No. 2011-279346, Jun. 12, 2015, 2 pgs.

*Primary Examiner* — A. Sefer
*Assistant Examiner* — Dilinh Nguyen
(74) *Attorney, Agent, or Firm* — Volpe and Koenig, P.C.

(57) ABSTRACT

Reliability is improved by improving adhesiveness, crack resistance, and moisture resistance of a metal member-resin jointed body by enhancing adhesiveness between the metal member and the resin.
A jointed body of a metal member and a resin including: an intermediate layer and a silane coupling agent layer formed on the metal member at an interface between the metal member and the resin, wherein the silane coupling agent layer and the resin are contacted; the intermediate layer is any one of an oxide layer of the metal, a chelating agent layer, a composite layer made of the oxide layer and the chelating agent layer, and a mixed layer made of the oxide and the chelating agent; and the intermediate layer has an electrically non-insulating characteristic, and a method of manufacturing the same.

11 Claims, 3 Drawing Sheets

(51) Int. Cl.
  *H01L 23/24* (2006.01)
  *H01L 23/48* (2006.01)
  *H01L 23/52* (2006.01)
  *H01L 23/00* (2006.01)
  *H01B 1/00* (2006.01)
  *H01L 23/31* (2006.01)
(52) U.S. Cl.
  CPC ............. *H01L2224/73265* (2013.01); *H01L 2924/00014* (2013.01); *H01L 2924/10253* (2013.01); *H01L 2924/15747* (2013.01)

(56) References Cited

FOREIGN PATENT DOCUMENTS

| | | |
|---|---|---|
| JP | 08-034276 A | 3/1996 |
| JP | 2003-342451 A | 12/2003 |
| JP | 2008-202133 A1 | 9/2008 |
| JP | 2009-263790 A1 | 11/2009 |
| JP | 2010-144148 A | 7/2010 |

\* cited by examiner

SEMICONDUCTOR PACKAGE HAVING A METAL MEMBER AND A RESIN MOLD, WHICH ARE BONDED TO A SILANE COUPLING AGENT AND AN INTERMEDIATE LAYER OF AN OXIDE FILM

FIELD OF THE INVENTION

The present invention relates to a method for adhering which improves adhesiveness force in joint of a metal member and a resin and a jointed body thereof. For example, a lead frame of a semiconductor package is included as an application field. In other words, the present invention relates to a method for manufacturing a lead frame, and particularly, relates to a plated copper lead frame used for a semiconductor device to which a mold package represented by an LOC structure is applied, and a method for manufacturing the same. Other than the above application, for example, the present invention relates to a metal plate covered with a resin film. More specifically, in order to improve adhesion between a metal member and a resin such as an epoxy resin adhesive or a silicone resin adhesive, adhesiveness with an adhesive is improved by applying oxidation treatment or a chelating agent treatment to the surface of a metal member and effectively forming an organic coating layer made of a single or a plurality of organic functional silanes on the treated surface.

BACKGROUND OF THE INVENTION

A jointed body of a metal and a resin is used in various fields, and adhesiveness between the resin and the metal member is important for improving reliability. For example, a 42 alloy and the like have been used as a material for a lead frame in the semiconductor field. However, use of copper is the mainstream these days in order to correspond to high performance semiconductors such as high speed semiconductors. One of the methods for packaging semiconductor is a method for using a resin.

A method for sealing with a resin is widely used because of a low price and excellent workability. However, there has been a problem in which deference of coefficients of thermal expansion between the resin and a lead frame material generates a gap between a lead frame and a resin package, and thereby, a semiconductor element deteriorates caused by inflow of water. Particularly, when copper is used for the lead frame, an oxide film is generated on the surface. This causes deterioration in adhesiveness between the lead frame and the resin. In order to solve the problem described above, the following four methods are mainly used.

(1) Method for Plating on Lead Frame

For example, a method for improving connection durability by plating Ni—Sn on the lead frame is described in Japanese Unexamined Patent Application Publication No. Sho 56 (1981)-17048 is exemplified.

(2) Method for Applying Silane Coupling Treatment on Lead Frame

For example, a method for manufacturing a lead frame including a process of primer treatment with a silane coupling agent in a region corresponding to a package area of the lead frame is described in Japanese Examined Patent Application Publication No. Hei 8 (1996)-34276.

(3) Method for Modifying Resin

A method for introducing a silane coupling agent into a resin is proposed. For example, a method in which a resin including an epoxy resin, a phenolic resin curing agent, a metal salt compound represented by a general formula $M_x(H_yPO_4)_z \cdot mE_2O$, an aminosilane coupling agent, a mercaptosilane compound, and an inorganic filler is used in order to provide a semiconductor sealing material having excellent adhesion to nickel plating and excellent moisture resistance and moldability as a sealing material for a power transistor is described in Japanese Unexamined Patent Application Publication No. 2003-342451 is included.

(4) Other Surface Treatment

For example, a method for forming a polydopamine film by contacting a dopamine solution onto a substrate surface to improve adhesiveness to an adhesive is described in Japanese Unexamined Patent Application Publication No. 2010-144148.

SUMMARY OF THE INVENTION

The present invention provides a technique and a jointing agent for improving adhesiveness between a metal member represented by a metal of Co, Ni, Fe, Cu, and Zn and an alloy thereof or a plated metal and a resin. For example, with regard to a lead frame, in a semiconductor device made by sealing a semiconductor element mounted on a lead frame having a plate layer represented by silver plating, nickel-palladium plating, or nickel-palladium-gold plating, the present invention aims to provide a semiconductor device having excellent solder resistance which prevents generation of cracks and detachment of the solder from a substrate in the semiconductor device at the time of a solder process after moisture absorption.

An important point in order to achieve this is to enhance adhesiveness between a targeted metal member and a sealing resin material. These materials are easy to be affected by oxidation or contamination, and as a result, sufficient adhesiveness to the resin cannot be obtained. Silane coupling treatment is introduced in order to improve the insufficient adhesiveness. However, satisfied results in corrosion resistance, heat resistance, and solvent resistance, particularly the corrosion resistance, is not obtained. In addition, an organic functional silane is not adhered well on the surface of the metal. Therefore, the silane is easy to be removed by rinsing or the like.

For enhancing the corrosion resistance performance with use of a silane coupling agent, the surface of the metal is often sequentially treated with a plurality of silane coupling agent, so that more processes are often required. Consequently, this treatment is inefficient in terms of energy, and needs a lot of time. Therefore, this treatment has many problems for practical use. In a method described in Patent Document 10, although a certain effect of prevention of cracks of a copper type package, its cost becomes huge. In the method described in Patent Document 11, adhesiveness is not fully improved due to a residual surface oxide film even when the surface is roughened.

The present invention is achieved based on the facts described above, and a purpose of the present invention is to provide a technique of excellent adhesiveness to a resin. For example, the purpose of the present invention is to provide a lead frame having no possibility of package crack generation at the time of processing to a semiconductor device and having high corrosion resistance, and to provide a method for manufacturing the lead frame having excellent adhesiveness to the resin.

In order to achieve the purpose described above, how a silane coupling agent layer for enhancing adhesiveness to the resin is formed on the metal member is important. As described in related arts, a silane coupling agent is a compound made of organic compounds and silicon, and acts as a mediator for bonding an organic material and an inorganic material, which usually are very difficult to be bonded with each other, because the silane coupling agent contains two or more different reactive groups in its molecule including a reactive group to form chemical bonding to the inorganic material and a reactive group to form chemical bonding to the organic material. However, in the related arts, sufficient adhesiveness force to the resin cannot be obtained even when the silane coupling treatment is performed. This is because the silane coupling agent layer is not sufficiently formed on the metal member. For the metal member of the present invention, the following two methods for improving the insufficient silane coupling layer formation are successfully found.

(1) Oxidation treatment for forming oxide on surface of metal member
(2) Chelating treatment for forming chelating agent layer on surface of metal member The metal member described here is made of Co, Ni, Fe, Cu, and Zn and an alloy thereof. A metal which is plated by nickel or the like on the surface of the metal member for enhancing corrosion resistance is also included (Basically, a corrosion environment includes the air system or water system. However, corrosion resistance is required for environments in a wide range of pH, because acidification or alkalization caused by decomposition or dissolution of surrounding substances and air pollutants or contamination of chlorides may occur).

With regard to (1), the oxidation is established by finding that generation of very thin oxide film on the surface of the metal is important for stably retaining the silane coupling agent on the surface of the metal member. The following three methods are included for generation of the very thin oxide film on the surface of the metal member and formation of the silane coupling agent layer on the very thin oxide film.

[1] To make an oxidizing agent having behavior to oxidize the surface of a metal member coexist in a solution containing a silane coupling agent.

[2] To immerse the surface of the metal member into a solution having behavior to oxidize the surface of the lead frame, before immersion of the surface of the metal member into the solution containing the silane coupling agent.

[3] To oxidize the surface of the lead frame in a dry environment before the immersion of the surface of the metal member into the solution containing the silane coupling agent.

With regard to [1], when a silane coupling agent, for example, 1,2-bis-(triethoxysilyl)ethane (hereinafter referred to as "BTSE") is used and aqueous hydrogen peroxide solution is used as an oxidizing agent, a very thin oxide film is formed on the surface of the metal member and BTSE molecules form strong coordination bonds with this oxide. In addition, the BTSE molecules also form covalent bonds with each other by applying thermal treatment, and a robust BTSE molecule film is formed on the surface of the metal member. As a result, a film being highly dense and having no faults as well as excellent adhesiveness is formed.

With regard to (2), this method is established by finding that generation of very thin chelating agent layer on the surface of the metal is important for stably retaining the silane coupling agent on the surface of the metal member. The following two methods are included for generation of the very thin chelating agent layer on the surface of the metal member and formation the silane coupling agent layer on the very thin chelating agent layer.

[1] To make a chelating agent forming the chelating agent layer on the surface of the metal member coexist in the solution containing the silane coupling agent.

[2] To immerse the surface of the metal member into a solution having behavior to form the chelating agent layer on the surface of the metal member, before immersion of the surface of the metal member into the solution containing the silane coupling agent.

Obviously, use of methods (1) and (2) at the same time, that is, formation of both the oxide layer and the chelating agent layer for effectively forming the silane coupling agent layer on the surface of the metal member is also effective.

According to the present invention, adhesiveness between the metal member and the resin can be improved by forming the silane coupling agent layer after forming the oxide layer or the chelating agent layer on the metal member, and a technique and a product having no detachment and cracks between the metal substrate and the resin in a jointed material of the metal member and the resin or the product using the jointed material can be provided.

DETAILED DESCRIPTION OF THE PREFERRED EMBODIMENTS

Figure 1:
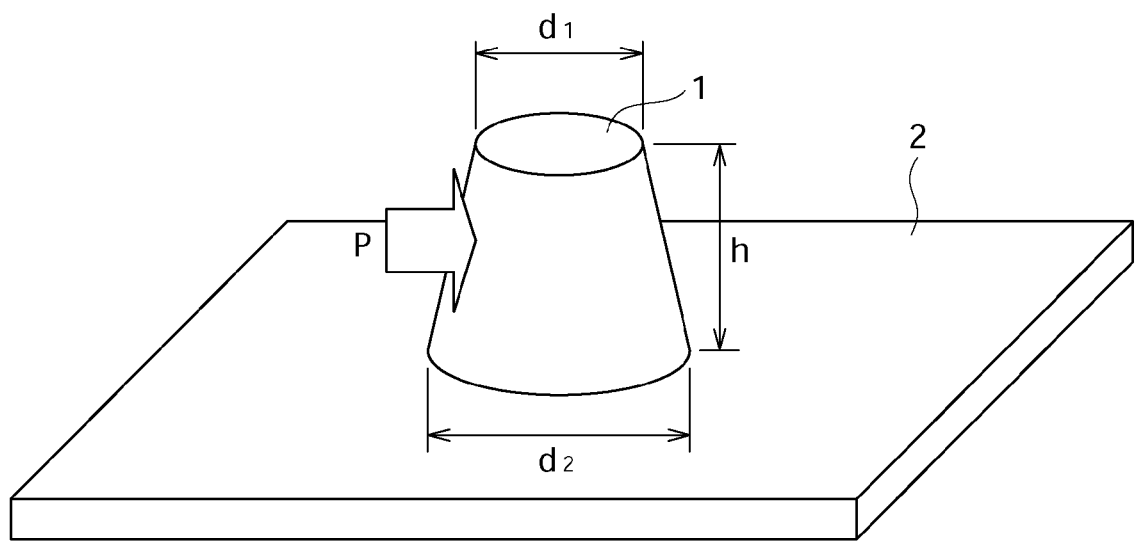
FIG. 1 is a schematic view of a test mold structure for evaluation of adhesion at an adhered part according to the present invention.

The present invention relates to improvement of adhesiveness between a metal member and a resin. The present invention includes two main methods. Namely, [1] a method for forming an oxide layer on a metal member and then forming a silane coupling layer thereon, and [2] is a method for forming a chelating agent layer on a metal member and then forming a silane coupling agent layer thereon. With regard to each of [1] and [2], the methods are divided into (1) a method for treating and forming the oxide layer or the chelating agent layer and forming the silane coupling agent layer at the same time (a method for immersing the metal member into a solution in which an oxidizing agent or a chelating agent and a silane coupling agent coexist), and (2) a method for forming the silane coupling agent layer after treating and forming the oxidation layer or the chelating agent layer (oxidation treatment and silane coupling treatment are separately performed). For convenience, the former treatment (1) is referred to as one-step treatment, and the later treatment (2) is referred to as two-step treatment. Hereinafter each case will be separately described.

*[1]-(1) With Regard to Method in which Silane Coupling Agent and Oxidizing Agent Coexist (One-Step Treatment)

[Solvent]: Solubility of some silane coupling agents into water is limited. Therefore, one or more solvents such as alcohol are basically used in order to improve solubility of the silane coupling agents. The alcohol also improves stability of the treatment solution and wettability to a metal substrate.

Basically, a solvent having high affinity with water is preferable because the silane coupling agent is required to be hydrolyzed. Specifically, methanol, ethanol, propanol, butanol and isomers thereof; ketones such as acetone, methylethylketone, and diethylketone; ethers such as dimethyl ether, ethylmethyl ether, diethyl ether, and tetrahydrofuran; and glycols such as ethylene glycol, propylene glycol, and diethylene glycol are used.

[Oxidizing agent]: Any oxidizing agents can be used as long as the oxidizing agent is a general oxidizing agent. As a function required for the oxidizing agent, obviously, it is required that the oxidizing agent has ability to oxidize the surface on the metal member. However, if the oxidizing ability is too high, the solvent described above is also oxidized. Therefore, a type and a concentration of the oxidizing agent is significantly important.

It is also obvious that a main component of the solution is the solvent described above. Water only exists in an amount for hydrolyzing the silane coupling agent described below. Therefore, the oxidizing agent having oxidation behavior even in a low concentration and high solubility is supplied. Hydrogen peroxide, chloric acid, perchloric acid, persulfuric acid, nitric acid and salts thereof and ceric ammonium nitrate are used. An adequate concentration of the oxidizing agent varies depending on the oxidizing agent used. For example, when hydrogen peroxide is used, the concentration is preferably 1 to 10% by volume, and more preferably 2 to 5% by volume.

[Silane Coupling Agent]

The silane coupling agents being used are classified into two main types described below.

One type is a silane coupling agent represented by a structure of $X_{3-n}SiR'SiX_{3-n}$, where n is 0 or 1; X is selected from a group consisting of a hydrolyzable group OR (R is represented by methyl, ethyl, ethylmethyl, propyl, butyl, isobutyl, s-butyl, t-butyl, and acetyl), and X may be the same as or different from each other. R' is selected from a group consisting of alkyl, alkenyl, and alkenyl substituted by at least one amino group or S group.

For example, bis(triethoxysilyl)ethane (BTSE); $(H_5C_2O)_3Si$—$CH_2CH_2$—$Si(OC_2H_5)_3$, bis(triethoxysilylpropyl)amine (BTSPA); $(H_5C_2O)_3Si$—$(CH_2)_3$—$NH$—$(CH_2)_3$—$Si(OC_2H_5)_3$, and bis(triethoxysilylproply)tetrasulfide (BTSPS); $(H_5C_2O)_3Si$—$(CH_2)_3$—$S_4$—$(CH_2)_3$—$Si(OC_2H_5)_3$ are included.

The other type is a silane coupling agent represented by a structure $X_{3-n}R_nSi$—Y as an organic functional silane, where n is 0 or 1; X is selected from a group consisting of a hydrolyzable group OR (R is represented by methyl, ethyl, ethylmethyl, propyl, butyl, isobutyl, s-butyl, t-butyl, and acetyl), and X may be the same as or different from each other; Y is selected from a group consisting of organic functional groups represented by amino, mercapto, phenyl, vinyl, epoxy, mathacryl, isocyanate, ureide, and sulfur and an alkyl group.

For example, vinyltriethoxy silane; $CH_2$=$CHSi(OCH_2CH_3)_3$, 3-glycidoxypropyltrimethoxy silane; $CH_2$—(O)—$CHCH_2OCH_2CH_2CH_2Si(OCH_3)_3$, 3-mercaptopropyl-triethoxy silane; $HSCH_2CH_2CH_2Si(OCH_2CH_3)_3$, 3-aminopropyltriethoxy silane; $H_2NCH_2CH_2CH_2Si(OCH_2CH_3)_3$, phenyltriethoxy silane; $(C_2H_5O)_3Si$—$C_6H_5$, 3-methacryloxypropyltriethoxy silane; $CH_2$=$C(CH_3)COOCH_2CH_2CH_2Si(OCH_2CH_3)_3$, 3-isocyanatepropyltri-methoxy silane; O=C=$NCH_2CH_2CH_2Si(OCH_2CH_3)_3$, decyltrimethoxy silane; $CH_3(CH_2)_9Si(OCH_3)_3$, 3-ureidepropyltriethoxysilane; $(C_2H_5O)_3SiC_3H_6NHC(O)NH_2$ are included.

Other than the silanes described above, octadecyltriethoxy silane, bis(triethoxysilyl)ethane, bis(triethoxysilyl)hexane, bis(triethoxysilyl)ethylene, bis(trimethoxysilyl)ethylbenzene, and the like are effective. The silane coupling agents described above are at least partially and preferably completely hydrolyzed. A concentration of these silane coupling agents is about 0.05 to 10% by weight, and more preferably 0.2 to 1% by weight. Water should be added because the silane coupling agent is required to be hydrolyzed. An adequate amount of water used is several percent's to 10% to the total treatment solution. When aqueous hydrogen peroxide solution is used, the solution is generally added in a state of 30%. Therefore, water is previously contained in the solution itself, and thereby newly additional water is not required.

Basically, a coupling layer is formed by immersing an object material into this treatment solution. However, spray coating and roll coating can be applicable. Formation of the coupling layer by an electrolytic method in which the object material is polarized to an anode or a cathode is also possible.

[pH Adjuster of the Silane Coupling Agent Solution]

pH of the solution strongly affects a hydrolysis reaction rate and an oxide generation rate. While pH of the solution is preferably maintained about less than 7 from the viewpoint of the hydrolysis reaction, the pH of the treatment solution is preferably maintained in a range of 3 to 12 because, for example, oxides of Ni and Cu stably exist in ranges of pH of 8 to 12, and 7 to 13, respectively, according to Pourbaix diagram (Literature: Atlas of Electrochemical Equilibria in Aqueous Solutions, Marcel Pourbaix, NACE International Cebelcor). Hydroxides such as potassium hydroxide, ammonia, sulfuric acid, hydrochloric acid, nitric acid and the like are suitable as a pH adjuster.

*[1]-(2) With Regard to Method for Immersing into Silane Coupling Agent Solution after Applying Oxidation Treatment (Two-Step Treatment)

[Oxidizing agent]: Any oxidizing agents can be used as long as the oxidizing agent is a general oxidizing agent. As a function required for the oxidizing agent, obviously, it is required that the oxidizing agent has ability to oxidize the surface of the metal member. Different from the method of (1), a strong oxidizing agent can be used in this method, because a solvent is not required to coexist when treatment is performed in a wet environment. As oxidizing agents which can be used in the wet environment, commencing with aqueous hydrogen peroxide solution, permanganic acid, chloric acid, dichromic acid, bromic acid, nitric acid, hypochlorous acid and salts thereof, peracetic acid, and ozone water can be used. In a dry environment, methods of air oxidation under heating and ozone oxidation are included.

[Silane Coupling Agent]

The silane coupling agent described in the method of [1]-(1) can be used.

In the method of [1]-(1), hydrolysis of the silane coupling agent is essential. However, when oxidation treatment is performed in a wet method of the method of [1]-(2), many hydroxyl groups exist on a generated oxide surface. These hydroxyl groups cause hydrolysis reaction of the silane coupling agent, so that water is not required to be intentionally added. However, when the oxide is generated in a dry environment, water is required to be added similar to the method of (1).

[pH Adjuster of the Silane Coupling Agent Solution]

Different from the method of [1]-(1), pH may be adjusted with only focusing on promotion of the hydrolysis reaction because generation of the oxide is not required at the time of silane coupling. In order to improve the hydrolysis reaction, the pH is desirably maintained 7 or less, and is preferably maintained among 3 to 6, if possible. Hydroxides such as potassium hydroxide, ammonia, sulfuric acid, hydrochloric acid, nitric acid and the like are suitable as the pH adjuster.

*[2]-(2) With Regard to Method for Immersing into Silane Coupling Agent Solution after Applying Chelating Agent Treatment (Two-Step Treatment)

[Solvent]: As solvents, usually pure water is used. However, alcohols such as methanol, ethanol, propanol, butanol and hexanol; ketones such as acetone and butanone, aliphatic hydrocarbons such as octane and hexane, organic solvents such as benzene, toluene, and xylene are also used singly or in combination, in consideration of solubility of a chelating agent. Also, a mixed solvent of these organic solvents and pure water can be used.

[Chelating agent]: The chelating agent described in the present invention means a compound having a plurality of donor electrons which can generate a chelating compound with a metal ion, and includes aminoalcohols (diethanolamine, pyrogallol, and the like), oxyacids (malic acid, tartaric acid, and the like), and amino acids (glycine, alanine, and the like). These chelating agents can be used singly or in combination of two or more of them.

Other than the chelating agents described above, various chelating agents, for example, chelating agents containing nitrogen such as nitrosophenols (o-nitrosophenol and the like) and hydroxyquinolines (8-hydroxyquinoline and the like) can be used. Particularly, the chelating agent having high effect is a chelating agent containing an amino group, and example of the chelating agent containing an amino group includes a polyaminocarboxylic acid compound. Specifically, ethylenediaminetetraacetic acid, hydroxyethylethylenediaminetriacetic acid, diethylenetriaminepentaacetic acid, diethylenetriaminepentaacetic acid, hydroxyethylethylenediaminetriacetic acid, trans-1,2-cyclohexadiaminetetraacetic acid, nitrilotriacetic acid, triethylenediaminehexaacetic acid, and ethylenediaminedisuccinic acid are included.

A concentration of these chelating agents may be in a range of forming homogeneous solution made by dissolving the chelating agent in a solvent, and, for example, is preferably about 0.1 to 2.0% by weight, and particularly further preferably 0.2 to 1.0% by weight. Also, salts of these chelating agents can be used. As a chelating agent containing S group, for example, dithiocarbamic acid-based chelating agents represented by dipotassium piperazine-1,4-dicarbodithioate, potassium diethylamine-N-dicarbodithioate are included. A method for forming the chelating agent layer of the surface of the metal member is not limited as long as the method generates formation of thin film of a chelating agent. Specific examples include a dipping method, spin coating, or the like. Of these methods, the dipping method can easily obtain a uniform film. A temperature in contact with the chelating agent is preferable a room temperature.

[Silane Coupling Agent]

The silane coupling agent described in the method of [1]-(1) can be used.

[pH Adjuster of the Silane Coupling Agent Solution]

Different from the method of [1]-(1), pH may be adjusted with only focusing on promotion of the hydrolysis reaction because generation of the oxide is not required at the time of silane coupling. In order to improve the hydrolysis reaction, the pH is desirably maintained 7 or less, and is preferably maintained among 3 to 6, if possible. Hydroxides such as potassium hydroxide, ammonia, sulfuric acid, hydrochloric acid, nitric acid and the like are suitable as the pH adjuster.

*[2]-(1) With Regard to Method in which Silane Coupling Agent and a Chelating Agent Coexist (One-Step Treatment)

[Solvent]: Solubility of some silane coupling agents into water is limited. Therefore, one re more solvents such as alcohol are basically used in order to improve solubility of the silane coupling agents.

[Chelating Agent], [Silane Coupling Agent]

The same agents as described above can be used.

When either the method of [1] or the method [2] is used, a period for immersing into the solution containing the silane coupling agent is preferably about 1 hour. In some cases, however, corrosion resistance may be improved by extending the immersion period to about 24 hours when a concentration of the silane coupling agent is set to 1% by weight or less.

After immersion treatment in the solution containing the silane coupling agent, the treated sample is dried by blowing air. Or, the sample may be dried by maintaining a temperature range from room temperature to 50° C.

Corrosion resistance can be improved by performing thermal treatment as post-treatment after the silane coupling treatment. In the thermal treatment, conditions of a temperature of 100 to 200° C. and a period of 30 minutes to 2 hours is preferable, and a condition of a temperature of 100 to 150° C. and a period of 30 minutes to 1 hour is more preferable.

Further, after the thermal treatment or after the drying, the corrosion resistance can be further improved by preforming the silane coupling treatment again in several times. In this case, a silane coupling treatment solution for the further treatment may not be the same as the silane coupling treatment solution for the first treatment.

When the silane coupling treatment period is set longer in the on-step treatment, a thickness of the silane coupling agent layer becomes thick and a function of the silane coupling agent layer becomes more effective. However, this causes disadvantages that surface roughness increases due to the coexisting oxidizing agent and stability of the silane coupling decreases depending on the sample. Solution for these disadvantages is the two-step treatment. The two-step treatment has an advantage that a sufficient silane coupling agent layer can be formed in a stable state because the silane coupling agent and the oxidizing agent do not coexist. However, the treatment has a disadvantage that treatment processes increase.

A resin used in the present invention is not limited as long as the resin is used for a common joint. For example, in the case of an epoxy-based resin, the resin includes an epoxy resin, a curing agent, and an inorganic filler as main components. This epoxy resin may contain at least two epoxy groups in one molecule. Example of the epoxy resin includes a phenol-novolac-type epoxy resin, a biphenyl-type epoxy resin, an ortho-cresol-novolac-type epoxy resin, a naphthalene ring containing epoxy resin, and a heterocyclic epoxy resin. These epoxy resins can be used singly or in combination.

The curing agent is not limited and is adequately selected depending on an epoxy resin used. For example, an amine-based curing agent and a phenol-novolac-type curing agent are included. Imidazole or a phosphine compound is desirably added in order to promote the reaction of the epoxy resin with the curing agent. Also, a silicone-based polymer may be added in order to reduce stress of an epoxy resin composition. Examples of the inorganic filler for the epoxy resin composition include crystalline silica, aluminum nitride, titanium oxide, and fused silica.

The following test is performed as adhesiveness evaluation. As illustrated in FIG. 1, an epoxy resin 1 (manufactured by Shin-Etsu Chemical Co., Ltd., KMC-184) is molded in a conical shape having a diameter of the bottom surface $d_2$ of 10 mm, a diameter of the top surface $d_1$ of 5 mm, and a height h of 10 mm on a test piece of a metal member 2 to which various types of treatment are applied, and fracture strength at an interface is measured by a shear test in which a load is applied form the side. Thereby, adhesiveness to a resin is evaluated. As adhesiveness strength to the resin, 10 MPa or more, 5 to 10 MPa, and 5 MPa or less are represented by good, moderate, and poor, respectively.

Hereinafter, specific embodiment of the present invention will be described.

(1) In a jointed body of a metal member and a resin of the present invention including an intermediate layer and a silane coupling agent layer formed on the metal member at an interface between the metal member and the resin, in which the silane coupling agent layer and the resin are contacted; the intermediate layer is any one of an oxide layer of the metal, a chelating agent layer, a composite layer made of the oxide layer and the chelating agent layer, and a mixed layer made of the oxide and the chelating agent; and the intermediate layer has an electrically non-insulating characteristic, the intermediate layer may be formed after the silane coupling agent layer or an integrated mixed layer may be formed by mixing the intermediate layer and the silane coupling agent layer, or the silane coupling agent may be bonded to the oxide layer and/or the chelating agent layer. In the present invention, while a method for forming the oxide layer and/or the chelating agent layer and treating with the silane coupling agent at the same time or a method for treating with heat after treating with the silane coupling agent is referred to as one-step treatment, a method for forming an oxide film and/or a chelating agent layer, and thereafter treating with the silane coupling agent is referred to as two-step treatment. Here, a method for treating with the silane coupling agent after forming an intermediate layer (the oxide film and/or the chelating agent layer) is preferable.

(2) In a jointed body of the present invention, a thickness of the oxide layer is preferably 100 Å or more and less than 1000 Å. A capture function of the silane coupling agent is insufficient when the thickness of the oxide layer is less than 100 Å, while the intermediate layer may become electric insulation when the thickness of the oxide layer exceeds 1000 Å.

(3) The intermediate layer may be the composite layer made of the oxide layer and the chelating agent layer or the mixed layer made of the oxide and the chelating agent. The intermediate layer is preferably the mixed layer in which the oxide layer and the chelating agent layer are integratedly mixed. The composite layer does not always need to be completely separated in two phases, and includes a layer having a state of forming concentration gradient in which the chelating agent penetrates the oxide film.

(4) The intermediate layer is preferably an oxide layer. The oxide layer contains OH group, and thereby, strong bond with the silane coupling agent can be expected. This is because the oxide film captures the silane coupling agent well and shows strong adhesiveness with each other.

(5) At least the surface of the metal member is made of copper, nickel, cobalt, zinc, or an alloy thereof. These metals are effective for improving electric conductivity or corrosion resistance of the metal member.

(6) The silane coupling agent is selected from a group represented by structures $X_{3-n}R_nSi—Y$ and $X_{3-n}SiR'SiX_{3-n}$. In the formulae described above, n is 0 or 1; X is a hydrolyzable group OR (R is represented by methyl, ethyl, ethylmethyl, propyl, butyl, isobutyl, s-butyl, t-butyl, and acetyl), and may be the same as or different from each other. Y is selected from a group consisting of organic functional groups represented by amino, mercapto, phenyl, vinyl, epoxy, mathacryl, isocyanate, ureide, and sulfur or an alkyl group; R is a methyl group; R' is one or more alkyl, alkenyl, or alkenyl substituted by at least one amino group or S group. When these silane coupling agents are used in a state of partial or complete hydrolysis, the bond strength between the oxide film and the chelating agent is increased.

(7) The chelating agent preferably has an N-containing group or an S-containing group. Particularly, aminoalcohols, oxyacids, and hydroxyquinolines are preferable.

(8) The metal member is preferably made of Co, Ni, Fe, Cu, Zn and alloys thereof, or a plated metal. These metals have characteristics of being easy to form an oxide film and being easy to be reacted with the chelating agent.

(9) According to the present invention, a method for manufacturing a jointed body of a metal member and a resin; the method including the steps of: forming an oxide layer of a metal made of the same metal as the metal member on the metal member, and thereafter contacting the oxide layer with an solution containing a silane coupling agent which is at least partially hydrolyzed; thereafter providing the silane coupling reaction layer on a metal substrate by removing a solvent to form an intermediate layer; thereafter jointing the metal member with the resin, in which the intermediate layer is any one of an oxide layer of the metal, a chelating agent layer, a composite layer made of the oxide layer and the chelating agent layer, and a mixed layer made of the oxide and the chelating agent; and the intermediate layer has an electrically non-insulating characteristic is provided.

(10) In the method for manufacturing the jointed body, atmosphere containing air, ozone, or oxygen is preferably used as the oxidizing agent used in the oxidation treatment.

(11) In the method for manufacturing the jointed body, solutions of hydrogen peroxide, nitric acid, persulfuric acid, ammonium cerium, permanganic acid, perchloric acid, and salts thereof can be used in the oxidation treatment.

(12) The silane coupling agents may be a mixture of two or more of them.

(13) The silane coupling agent is preferably used as a solution in which the silane coupling agent is dissolved in a solvent.

(14) In the method for manufacturing the jointed body, the intermediate layer is formed by immersing the metal member into a chelating agent solution, and thereafter, the immersed metal member can be immersed into the solution containing the silane coupling agent.

(15) The intermediate layer is formed by immersing the metal member into a solution containing the oxidizing agent and the chelating agent, and thereafter, the immersed metal member can be immersed into the solution containing the silane coupling agent.

(16) The present invention further provides a method for adhering a metal and a resin, the method including the steps of: forming an intermediate layer by applying oxidation treatment, chelating agent treatment, or a combination of the oxidation treatment and the chelating agent treatment to a metal member on the surface of the metal member; and subsequently contacting the metal member with a solution containing one or more hydrolyzed or partially hydrolyzed organic functional silanes and a solvent, thereafter forming a silane coupling reaction layer on the intermediate layer on the metal member by removing the solvent, and thereafter applying thermal treatment, in which the intermediate layer is any one of an oxide layer of the metal, a chelating agent layer, a composite layer made of the oxide layer and the chelating agent layer, and a mixed layer made of the oxide and the chelating agent; and the intermediate layer has an electrically non-insulating characteristic.

Subsequently, Examples and Comparative examples of the present invention will be described in detail.

COMPARATIVE EXAMPLES 1 to 10

An untreated lead frame, nickel plated and nickel alloy plated lead frames, and lead frames which were treated with various silane coupling agents as surface treatment, which are related arts, are shown in Table 1 as Comparative examples 1 to 10. A concentration of the silane coupling was 1.0% by weight, and ethanol was used as a solvent. Every sample was treated with heat at 100° C. for 1 hour after immersing into the silane coupling agent solution.

Comparative example 1 is the case where no surface treatment of Cu was applied and adhesiveness to a resin was determined as poor. Comparative example 2 is the case where Ni plating is applied in order to provide corrosion resistance to the Cu material, and adhesiveness to the resin was also determined as poor. Comparative examples 3 and 4 are the cases where silane coupling treatment to nickel plated copper was performed in order to improve adhesiveness force to the resin as described in the related art, and, adhesiveness to the resin was evaluated. However, adhesiveness strength was determined as poor, and sufficient adhesiveness strength was not able to be obtained.

Comparative example 5 where adhesiveness between silane coupling treated copper and the resin was evaluated, and the result of adhesiveness strength was determined as moderate. Comparative examples 6 and 7 are cases where 42% Ni—Fe alloy was used as a metal substrate. In both comparative examples, adhesiveness strength was determined as poor, and sufficient adhesiveness strength was not able to be obtained. Comparative examples 8 and 9 are the cases where Ni or Co was used as a metal substrate and no surface treatment was applied, and adhesiveness to the resin was determined as poor. Comparative example 10 is the case where silane coupling treatment was applied to an Ni substrate using 3-glycidoxypropyltrimethoxy silane. However, adhesiveness strength to the resin was determined as moderate, and sufficient adhesiveness strength was not able to be obtained.

treated with heat at 100° C. for 1 hour after immersing into the silane coupling agent solution. The oxidizing agent used was hydrogen peroxide. Various silane coupling agents were used to perform the one-step treatment. Adhesiveness strengths to the resin are determined as good in every case. As can be seen from comparison between Comparative example 3 and Example 4, the adhesiveness forces were dramatically improved.

Examples 7 to 11 are the cases where the method of [1]-(1) in which the silane coupling agent and the oxidizing agent coexist is applied to various metal members. Investigated results of adhesiveness to the resin are shown. Plating was not applied. The oxidizing agent used was hydrogen peroxide. 3-aminopropyltriethoxy silane was used to perform the one-step treatment. Adhesiveness strengths to the resin were determined as good in every case. As can be seen from comparison to Comparative examples 5 and 10, the adhesiveness forces are dramatically improved. What is called a natural oxidation film formed by oxygen in the air exists on the surface of the metal. It was determined by XRD analysis that the oxide film according to the present invention has a more amount of OH group (an absolute value) compared to the natural oxidation film.

However, as obviously seen from comparison of Table 1 and Table 2, the silane coupling agent is not sufficiently affected when only the natural oxidation film exists, and aggressive introduction of the oxidation treatment is significantly effective. In the cases shown in Comparative examples, the natural oxidation film is generated on the metal by an oxidation process caused by oxygen in the air. A thickness of the natural oxidation film is 50 Å in Al, 50 Å in Cu, 30 Å in Si, 30 Å in Ti, and 50 Å in Ni. Difference among the type of metal is rarely observed. The silane coupling agent is not sufficiently affected in the case of the oxide having such a degree of thickness. A thickness of the oxide layer generated in

TABLE 1

| Comparative example No. | Metal member | | | Adhesiveness strength to resin |
|---|---|---|---|---|
| | Substrate | Plating | Silane coupling treatment | |
| 1 | Cu | None | None | poor |
| 2 | Cu | Ni | None | poor |
| 3 | Cu | Ni | 3-aminopropyltriethoxy silane | poor |
| 4 | Cu | Ni | 3-glycidoxypropyltrimethoxy silane | poor |
| 5 | Cu | None | 3-glycidoxypropyltrimethoxy silane | moderate |
| 6 | 42% Ni—Fe | None | None | poor |
| 7 | 42% Ni—Fe | None | 3-aminopropyltriethoxy silane | poor |
| 8 | Ni | None | None | poor |
| 9 | Co | None | None | poor |
| 10 | Ni | None | 3-glycidoxypropyltrimethoxy silane | moderate |

EXAMPLES 1 to 11

Examples 1 to 6 are the cases where the method of [1]-(1) in which the silane coupling agent and the oxidizing agent coexist was applied to metal members to which a copper substrate was plated with Ni. Investigated results of adhesiveness to the resin are shown in Table 2. A concentration of the silane coupling was 1.0% by weight, and ethanol was used as a solvent. A concentration of aqueous hydrogen peroxide solution used as the oxidizing agent was set to 10% by using 30% aqueous hydrogen peroxide solution. Every sample was Examples is 100 Å or more and less than 1000 Å. This degree of thickness is required for the silane coupling agent to be sufficiently affected. When the thickness of the oxide film is set to 1000 Å or more, for example, 2000 Å by a method in which immersion time is extended, conductivity of a layer made of the intermediate layer (the oxide film and/or the chelating agent layer) and the silane coupling agent layer cannot be maintained, and problems may arise depending on a method for manufacturing thereafter. Therefore, it is not adequate that the thickness of the oxide film is set thicker than necessary.

TABLE 2

| Example No. | Metal member | | Silane coupling treatment (one-step treatment) | | Adhesiveness strength to resin |
|---|---|---|---|---|---|
| | Substrate | Plating | Silane coupling agent | Oxidizing agent | |
| 1 | Cu | Ni | 3-aminopropyltriethoxy silane | $H_2O_2$ | Good |
| 2 | Cu | Ni | 3-glycidoxypropyltriethoxy silane | $H_2O_2$ | Good |
| 3 | Cu | Ni | Bis(triethoxysilyl) ethane | $H_2O_2$ | Good |
| 4 | Cu | Ni | Bis(triethoxysilyl) propylamine | $H_2O_2$ | Good |
| 5 | Cu | Ni | N-2-(amino ethyl)-3-aminopropyltriethoxy silane | $H_2O_2$ | Good |
| 6 | Cu | Ni | 2-(3,4-epoxycyclohexyl)ethyltrimethoxy silane | $H_2O_2$ | Good |
| 7 | Ni | None | 3-aminopropyltriethoxy silane | $H_2O_2$ | Good |
| 8 | Co | None | 3-aminopropyltriethoxy silane | $H_2O_2$ | Good |
| 9 | Fe | None | 3-aminopropyltriethoxy silane | $H_2O_2$ | Good |
| 10 | Cu | None | 3-aminopropyltriethoxy silane | $H_2O_2$ | Good |
| 11 | Zn | None | 3-aminopropyltriethoxy silane | $H_2O_2$ | Good |

EXAMPLES 12 to 19

Investigated result with regard to the method of [1]-(2) in which the metal members are immersed into the silane coupling agent solution after applying oxidation treatment are shown in Table 3. Basically, metal members in which Cu or Ni alloy is used as a substrate and Ni plating or Ni—Sn plating are applied thereto are used. Every sample was treated with heat at 100° C. for 1 hour after immersing into the silane coupling agent solution. A concentration of the silane coupling agent was 1.0% by weight, and ethanol was used as a solvent. Examples 12 to 14 are the cases where the metal member is immersed into the aqueous hydrogen peroxide solution for oxidation treatment being the first-step treatment in the two-step treatment and then immersed into the silane coupling agent solution as the second-step treatment.

A 10% concentration the aqueous hydrogen peroxide solution was prepared from 30% aqueous hydrogen peroxide solution, and ethanol was used as a solvent. In every Example, high adhesiveness strengths to the resin were obtained. Examples 15 to 19 are the cases where thermal treatment was applied to the metal member as the oxidation treatment being the first-step treatment in the two-step treatment and then the metal member is immersed into the silane coupling agent solution as the second-step treatment. Conditions of the thermal treatment were heat treatment in the air at 200° C. for 1 min. In every Example, high adhesiveness strengths to the resin were obtained.

High adhesiveness strengths to the resin are also obtained in the cases where different plating is applied (Examples, 18 and 19), and in the case of different substrate is used (Example 19).

Comparative examples 11 and 12 (Table 4) are the cases where the second treatment of immersing the metal member into the silane coupling solution was not performed. Each of the adhesiveness to the resin was poor. When Examples 12 and 13 and Examples 15 and 16 are compared with Comparative example 11 and Comparative example 12, respectively, it can be seen that the methods increase the adhesiveness to the resin.

TABLE 3

| Example No. | Metal member | | Silane coupling treatment (two-step treatment) | | Adhesiveness strength to resin |
|---|---|---|---|---|---|
| | Substrate | Plating | Oxidation treatment (first step) | Silane coupling agent (second step) | |
| 12 | Cu | Ni | $H_2O_2$ | 3-aminopropyltriethoxy silane | Good |
| 13 | Cu | Ni | $H_2O_2$ | 3-glycidoxypropyltriethoxy silane | Good |
| 14 | Cu | Ni | $H_2O_2$ | Bis(triethoxysilyl) ethane | Good |
| 15 | Cu | Ni | Thermal treatment | 3-aminopropyltriethoxy silane | Good |
| 16 | Cu | Ni | Thermal treatment | Bis(triethoxysilyl) propylamine | Good |
| 17 | Cu | Ni | Thermal treatment | N-2-(amino ethyl)-3-aminopropyltriethoxy silane | Good |
| 18 | Cu | Sn—Ni | Thermal treatment | Bis(triethoxysilyl) propylamine | Good |
| 19 | 42% Ni—Fe | Sn—Ni | Thermal treatment | Bis(triethoxysilyl) propylamine | Good |

TABLE 4

| Comparative example No. | Metal member | | Oxidation treatment | Adhesiveness strength to resin |
|---|---|---|---|---|
| | Substrate | Plating | | |
| 11 | Cu | Ni | $H_2O_2$ | Poor |
| 12 | Cu | Ni | Thermal treatment | Poor |

EXAMPLES 20 to 26

Investigated result with regard to the method of [2]-(2) in which the metal members were immersing into the silane coupling agent solution after applying chelating agent treatment are shown in Table 3. Basically, metal members in which Cu was used and Ni plating was applied thereto were used. Every sample was treated with heat at 100° C. for 1 hour after immersing into the silane coupling agent solution. A concentration of the silane coupling was 1.0% by weight, and ethanol was used as a solvent.

Examples 20 to 24 are the cases where EDTA-2Na was used as the chelating agent in the first step and various silane coupling agent were used. The reason why 2Na salt was used is to increase solubility of the chelating agent to water. A concentration of the chelating agent solution was 2%, and water was used as a solvent. In every Example, high adhesiveness strengths to the resin were obtained. Example 25 is the case where the chelating agent and the oxidizing agent (hydrogen peroxide) were used in combination in the first-step treatment. Also in this case, high adhesiveness strength to the resin was obtained. Example 26 is the case where ethylenediaminedisuccinic acid-3Na salt was used as the chelating agent. Similar to the case where EDTA was used, high adhesiveness force to the resin was obtained.

Comparative examples 13 and 14 (Table 6) are the cases where the silane coupling treatment being the second-step treatment was not performed. In both Comparative examples, high adhesiveness forces were not obtained by only applying the chelating agent treatment.

isted (one-step treatment) in Table 3. Every sample was treated with heat at 100° C. for 1 hour after immersing into the silane coupling agent solution. A concentration of the silane coupling was 1.0% by weight, and ethanol was used as a solvent. Basically, metal members in which Cu is used as the substrate and Ni plating is applied thereto were used. Examples 27 to 31 are the cases where ethylenediaminetet-

TABLE 5

| Example No. | Metal member | | Silane coupling treatment (two-step treatment) | | Adhesiveness strength to resin |
|---|---|---|---|---|---|
| | Substrate | Plating | Chelating agent solution (first step) | Silane coupling agent (second step) | |
| 20 | Cu | Ni | Ethylenediaminetetraacetic acid-2Na salt | 3-aminopropyltriethoxy silane | Good |
| 21 | Cu | Ni | Ethylenediaminetetraacetic acid-2Na salt | 3-glycidoxypropyltriethoxy silane | Good |
| 22 | Cu | Ni | Ethylenediaminetetraacetic acid-2Na salt | Bis(triethoxysilyl) ethane | Good |
| 23 | Cu | Ni | Ethylenediaminetetraacetic acid-2Na salt | 3-aminopropyltriethoxy silane | Good |
| 24 | Cu | Ni | Ethylenediaminetetraacetic acid-2Na salt | Bis(triethoxysilyl) propylamine | Good |
| 25 | Cu | Ni | Ethylenediaminetetraacetic acid-2Na salt + $H_2O_2$ | 3-aminopropyltriethoxy silane | Good |
| 26 | Cu | Ni | Ethylenediaminedisuccinic acid-3Na salt | 3-aminopropyltriethoxy silane | Good |

TABLE 6

| Comparative example No. | Metal member | | Chelating treatment | Adhesiveness strength to resin |
|---|---|---|---|---|
| | Substrate | Plating | | |
| 13 | Cu | Ni | Ethylenediaminetetraacetic acid-2Na salt | Poor |
| 14 | Cu | Ni | Ethylenediaminedisuccinic acid-3Na salt | Poor |

EXAMPLES 27 to 31

Investigated result with regard to the method of [2]-(1) in which the silane coupling agent and the chelating agent coexisted (one-step treatment) in Table 3. Every sample was raacetic acid-2Na salt was used as the chelating agent, and one or more various silane coupling agents and the chelating agent coexisted in the solution. In every Example, high adhesiveness strengths were obtained.

TABLE 7

| Example No. | Metal member | | Silane coupling treatment (one-step treatment) | | Adhesiveness strength to resin |
|---|---|---|---|---|---|
| | Substrate | Plating | Chelating agent solution | Silane coupling agent | |
| 27 | Cu | Ni | Ethylenediaminetetraacetic acid-2Na salt | 3-aminopropyltriethoxy silane | Good |
| 28 | Cu | Ni | Ethylenediaminetetraacetic acid-2Na salt | 3-glycidoxypropyltrimethoxy silane | Good |
| 29 | Cu | Ni | Ethylenediaminetetraacetic acid-2Na salt | Bis(triethoxysilyl) ethane | Good |
| 30 | Cu | Ni | Ethylenediaminetetraacetic acid-2Na salt | 3-aminopropyltriethoxy silane | Good |
| 31 | Cu | Ni | Ethylenediaminetetraacetic acid-2Na salt | Bis(triethoxysilyl)propylamine | Good |

EXAMPLES 32 to 36

Figure 2A:
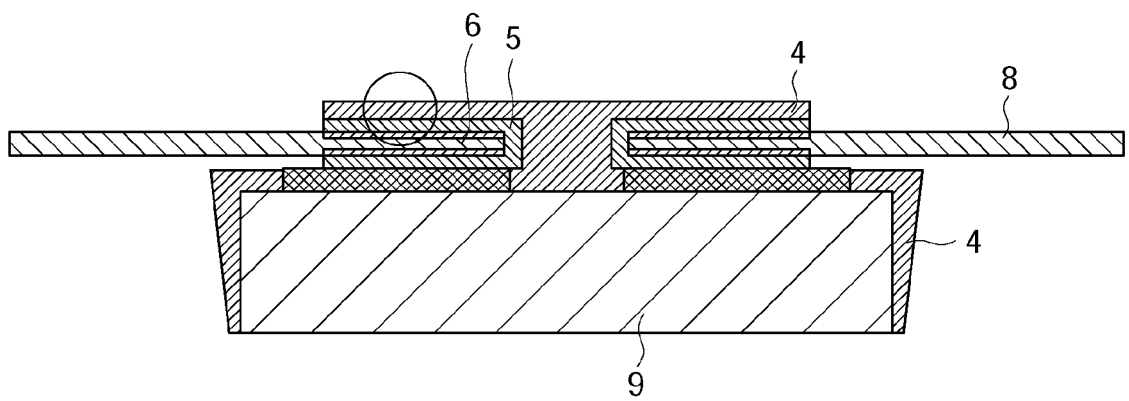
FIG. 2A is a schematic cross-sectional view of a semiconductor package to which the present invention is applied.

In these Examples, reliability when each of lead frames in the case of applying and in the case of not applying the treatment of the present invention was incorporated into the semiconductor package illustrated in FIG. 2A was evaluated. The evaluated results are shown in Table 8. In FIG. 2A, the numerical sign 4 is a resin mold; the numerical sign 5 is a silane coupling agent layer; the numerical sign 6 is an intermediate layer; the numerical sign 7 is a plating layer formed on the lead frame 8; and the numerical sign 9 is a semiconductor element.

Figure 2B:
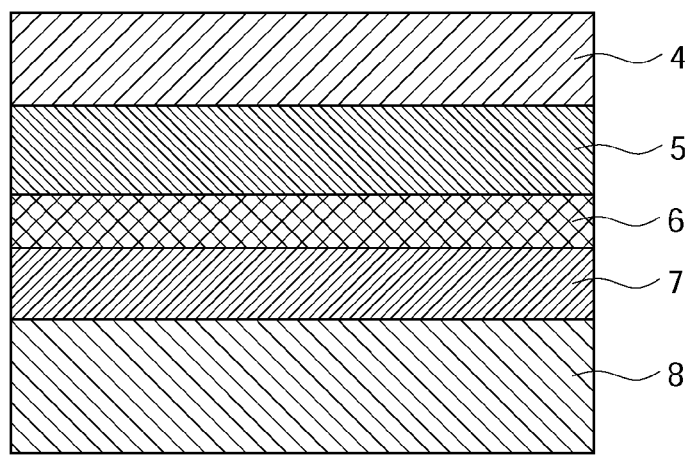
FIG. 2B is a magnified view of a surrounded part by a circle in FIG. 2A.

A magnified view of a surrounded part by a circle in FIG. 2A is illustrated in FIG. 2B. Every sample was treated with heat at 100° C. for 1 hour after immersing into the silane coupling agent solution. A concentration of the silane coupling was 1.0% by weight, and ethanol was used as a solvent. (1) Adhesiveness, (2) crack resistance, and (3) moisture resistance reliability between the lead frame and the resin of the prepared semiconductor package were evaluated by the methods described below.

(1) Adhesiveness: A semiconductor package in which resin sealing and after curing were performed was exposed for moisture absorption for 48 hours under conditions of 85° C. and 85% RH, and thereafter, the semiconductor package was immersed into a solder bath of 260° C. for 10 s. With regard to the taken out semiconductor package, adhesiveness between the sealing resin and the back surface of the lead frame stage was evaluated using a scanning acoustic tomograph. As evaluation criteria, the case that the entire surface is adhered is defined as good; the case the center part is adhered but surrounding part is detached is defined as moderate; and the case that the entire surface is detached is defined as poor.

(2) Crack resistance: At the same time of the evaluation of (1), the number of generated external cracks was counted (per 10 samples).

(3) Moisture resistance reliability: A semiconductor package in which resin sealing and after curing were performed was immersed into a solder bath of 260° C. for 10 s, and the semiconductor package was tested by a pressure cooker bias test under a saturated pressurized vapor atmosphere at 125° C., with applying bias voltage of 20 V. With regard to each 20 semiconductor packages mounting silicon chip for evaluation, the number of semiconductor packages in which open failure is caused by corrosion of the aluminum wiring after 80 and 200 hours later was counted. When the surface treatment described in Examples described above is applied to the lead frame, all of the adhesiveness, the crack resistance, and the moisture resistance reliability shows excellent performance.

TABLE 8

| Example No. | Lead frame | | | Adhesiveness | Crack resistance | Moisture resistance reliability | |
| | Substrate | Plating | Surface treatment | | | 80 h | 200 h |
| --- | --- | --- | --- | --- | --- | --- | --- |
| 32 | Cu | Ni | Example 1 | Good | 0 | 0 | 1 |
| 33 | Cu | Ni | Example 13 | Good | 0 | 0 | 2 |
| 34 | Cu | Ni | Example 16 | Good | 0 | 0 | 0 |
| 35 | Cu | Ni | Example 20 | Good | 0 | 0 | 1 |
| 36 | Cu | Ni | Example 20 | Good | 0 | 0 | 1 |

COMPARATIVE EXAMPLES 15 to 19

When the surface treatment described in Comparative examples described above is applied to the lead frame, none of the adhesiveness, the crack resistance, and the moisture resistance reliability showed sufficient performance. The results are shown in Table 9.

TABLE 9

| Comparative example No. | Lead frame | | | Adhesiveness | Heat resistance | Moisture resistance reliability | |
| | Substrate | Plating | Surface treatment | | | 80 h | 200 h |
| --- | --- | --- | --- | --- | --- | --- | --- |
| 15 | Cu | Ni | Comparative example 1 | Poor | 10 | 5 | 9 |
| 16 | Cu | Ni | Comparative example 2 | Poor | 8 | 5 | 8 |
| 17 | Cu | Ni | Comparative example 3 | Poor | 7 | 3 | 6 |
| 18 | Cu | Ni | Comparative example 7 | Poor | 6 | 4 | 8 |
| 19 | Cu | Ni | Comparative example13 | Poor | 4 | 4 | 6 |

EXAMPLE 37 to 46

Relation between reliability and whether the treatment of the present invention is performed or not was evaluated to the lead frame of the semiconductor package illustrated in FIG. 2A, and the results are shown in Table 10 and Table 11. In Tables 10 to 13, the number of cycles is the number of temperature cycle loads and the number of generated defects is the number of defects to the number of samples of denominator.

(1) The adhesiveness was evaluated in a manner that semiconductor packages in which resin sealing and after curing were performed by transfer molding were exposed for moisture absorption for 48 hours under conditions of 85° C. and 85% RH, and thermal treatment with a solder reflow oven having a peak temperature of 280° C./10 minutes is also applied to the semiconductor packages. To the package after thermal treatment, a temperature cycle load of −55° C., 10 minutes/150° C., 10 minutes was repeatedly applied, and thereafter a detachment state between the lead frame part and the sealing resin part was evaluated using the scanning acoustic tomograph. As evaluation criteria (the number of generated adhesiveness defects), the case that the entire surface is adhered and the detachment did not reach the element is defined as good and the case that the detachment reached the element is defined as poor. The number of the packages (the number of cycles) obtaining good in the number of the samples was counted.

(2) Electric reliability: At the same time of the evaluation of (1), leak current of the element was measured, and the sample whose leak current became 1.2 times the initial value was determined as the number of generated electrical property defects (unacceptable product in terms of the electrical property).

TABLE 10

| Example No. | Pretreatment | | | Number of generated adhesiveness defects (Cycle number) | | | | Number of generated electrical property defects (Cycle number) | | | |
|---|---|---|---|---|---|---|---|---|---|---|---|
| | Substrate | Plating | Surface treatment | 0 | 500 | 100 | 2000 | 0 | 500 | 100 | 2000 |
| 37 | Cu | Ni | Example 1 | 0/20 | 0/20 | 0/20 | 0/20 | 0/20 | 0/20 | 0/20 | 0/20 |
| 38 | Cu | Ni | Example 8 | 0/20 | 0/20 | 0/20 | 0/20 | 0/20 | 0/20 | 0/20 | 0/20 |
| 39 | Cu | Ni | Example 11 | 0/20 | 0/20 | 0/20 | 0/20 | 0/20 | 0/20 | 0/20 | 0/20 |
| 40 | Cu | Ni | Example 15 | 0/20 | 0/20 | 0/20 | 0/20 | 0/20 | 0/20 | 0/20 | 0/20 |
| 41 | Cu | Ni | Example 19 | 0/20 | 0/20 | 0/20 | 0/20 | 0/20 | 0/20 | 0/20 | 0/20 |

TABLE 11

| Example No. | Pretreatment | | | Number of generated adhesiveness defects (Cycle number) | | | | Number of generated electrical property defects (Cycle number) | | | |
|---|---|---|---|---|---|---|---|---|---|---|---|
| | Substrate | Plating | Surface treatment | 0 | 500 | 100 | 2000 | 0 | 500 | 100 | 2000 |
| 42 | Cu | — | Example 1 | 0/20 | 0/20 | 0/20 | 0/20 | 0/20 | 0/20 | 0/20 | 0/20 |
| 43 | Cu | — | Example 8 | 0/20 | 0/20 | 0/20 | 0/20 | 0/20 | 0/20 | 0/20 | 0/20 |
| 44 | Cu | — | Example 11 | 0/20 | 0/20 | 0/20 | 0/20 | 0/20 | 0/20 | 0/20 | 0/20 |
| 45 | Cu | — | Example 15 | 0/20 | 0/20 | 0/20 | 0/20 | 0/20 | 0/20 | 0/20 | 0/20 |
| 46 | Cu | — | Example 19 | 0/20 | 0/20 | 0/20 | 0/20 | 0/20 | 0/20 | 0/20 | 0/20 |

COMPARATIVE EXAMPLES 20 to 29

By applying the surface treatment described in the Examples described above to the lead frame, the adhesiveness between the resin and the lead frame was able to be assured; extension of the detachment is not observed even when the temperature cycle loads are applied; and the electric reliability showed excellent performance. On the contrary, when the treatment described in Comparative examples is applied, detachment between the lead frame and the resin part was generated and the electrical reliability was not able to be assured. The evaluated results are shown in Table 11 and Table 13.

TABLE 12

| Comparative example No. | Pretreatment | | | Number of generated adhesiveness defects (Cycle number) | | | | Number of generated electrical property defects (Cycle number) | | | |
|---|---|---|---|---|---|---|---|---|---|---|---|
| | Substrate | Plating | Surface treatment | 0 | 500 | 100 | 2000 | 0 | 500 | 100 | 2000 |
| 20 | Cu | Ni | Comparative example 1 | 3/20 | 7/20 | 19/20 | 20/20 | 2/20 | 5/20 | 18/20 | 20/20 |
| 21 | Cu | Ni | Comparative example 3 | 4/20 | 10/20 | 18/20 | 20/20 | 3/20 | 7/20 | 18/20 | 20/20 |
| 22 | Cu | Ni | Comparative example 4 | 5/20 | 9/20 | 18/20 | 20/20 | 2/20 | 6/20 | 17/20 | 20/20 |
| 23 | Cu | Ni | Comparative example 11 | 4/20 | 9/20 | 18/20 | 20/20 | 3/20 | 7/20 | 18/20 | 20/20 |
| 24 | Cu | Ni | Comparative example 13 | 4/20 | 8/20 | 19/20 | 20/20 | 2/20 | 6/20 | 19/20 | 20/20 |

TABLE 13

| Comparative example No. | Pretreatment | | | Number of generated adhesiveness defects (Cycle number) | | | | Number of generated electrical property defects (Cycle number) | | | |
|---|---|---|---|---|---|---|---|---|---|---|---|
| | Substrate | Plating | Surface treatment | 0 | 500 | 100 | 2000 | 0 | 500 | 100 | 2000 |
| 25 | Cu | — | Comparative example 1 | 1/20 | 1/20 | 12/20 | 20/20 | 0/20 | 5/20 | 10/20 | 20/20 |
| 26 | Cu | — | Comparative example 3 | 0/20 | 1/20 | 14/20 | 20/20 | 0/20 | 7/20 | 12/20 | 20/20 |
| 27 | Cu | — | Comparative example 4 | 0/20 | 1/20 | 16/20 | 20/20 | 0/20 | 6/20 | 14/20 | 20/20 |
| 28 | Cu | — | Comparative example 11 | 0/20 | 0/20 | 15/20 | 20/20 | 0/20 | 7/20 | 15/20 | 20/20 |
| 29 | Cu | — | Comparative example 13 | 0/20 | 1/20 | 16/20 | 20/20 | 0/20 | 6/20 | 15/20 | 20/20 |

Figure 3A:
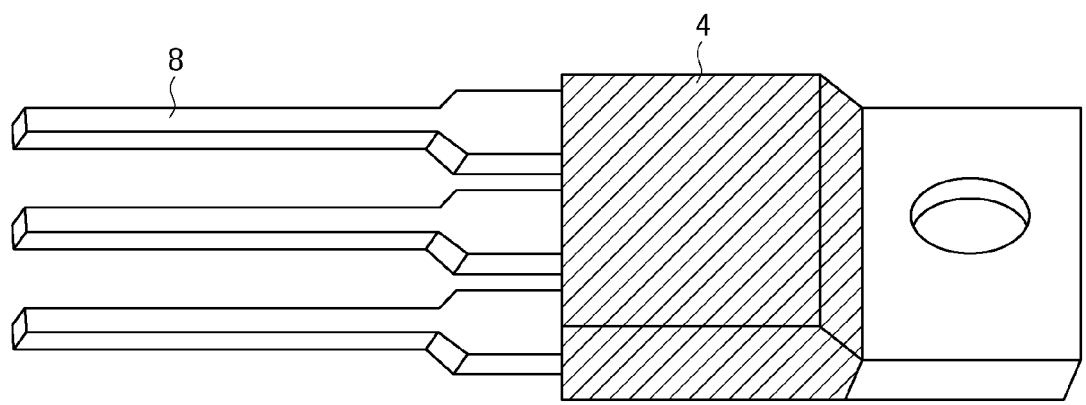
FIG. 3A is a perspective view illustrating an appearance structure of the semiconductor package according to the present invention.
Figure 3B:
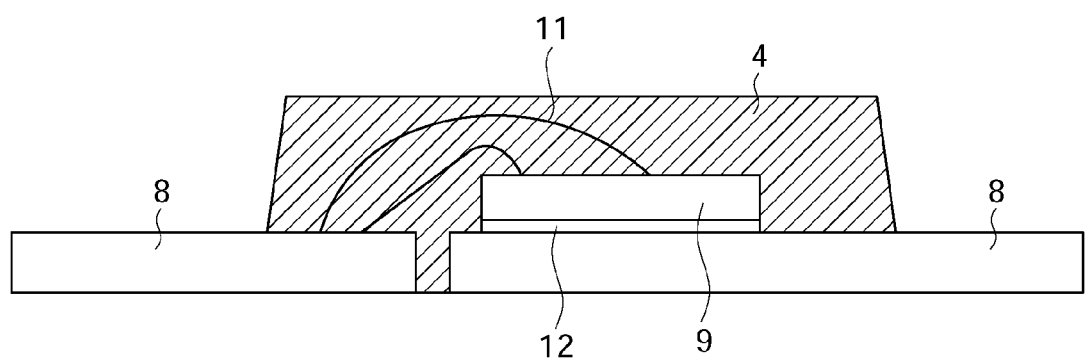
FIG. 3B is a cross-sectional view of the semiconductor package of FIG. 3A.

FIG. 3A is a perspective view illustrating an appearance structure of the semiconductor package according to the present invention, and FIG. 3B is a cross-sectional view of the semiconductor package of FIG. 3A. In FIG. 3A, the numerical sign 8 is a conductive lead, and the numerical sign 4 is a resin mold package. In FIG. 3B, the numerical sign 8 is a lead; the numerical sign 9 is a semiconductor element; the numerical sign 4 is a resin mold package; the numerical sign 11 is a bonding wire; and the numerical sign 12 is a die attach material.

What is claimed is:

1. A jointed body of a metal member and a resin comprising an intermediate layer and a silane coupling agent layer formed on the metal member at an interface between the metal member and the resin, wherein the silane coupling agent layer and the resin are contacted,
the intermediate layer is any one of an oxide layer of the metal, a chelating agent layer, a composite layer made of the oxide layer and the chelating agent layer, and a mixed layer made of the oxide and the chelating agent, and
the intermediate layer has an electrically non-insulating characteristic, wherein the silane coupling agent is represented by a structure of $X_{3-n}R_nSi\text{—}Y$ or $X_{3-n}SiR'Si\text{-}X_{3-n}$,
where n is 0 or 1; X is selected from a group consisting of a hydrolyzable group OR (R is represented by methyl, ethyl, ethylmethyl, propyl, butyl, isobutyl, s-butyl, t-butyl, and acetyl); X may be the same as or different from each other; Y is selected from a group consisting of organic functional groups represented by amino, mercapto, phenyl, vinyl, epoxy, methacryl, isocyanate, ureide, and sulfur or an alkyl group; R is a methyl group; and R' is one or more groups selected from a group consisting of alkyl, alkenyl, and alkenyl substituted by at least one amino group or S group.

2. A jointed body of a metal member and a resin according to claim 1, wherein said thickness of the oxide layer is 100 Å or more and less than 1000 Å.

3. The jointed body of the metal member and the resin according to claim 1, where in the intermediate layer is the composite layer made of the oxide layer and the chelating agent layer or the mixed layer made of the oxide and the chelating agent.

4. The jointed body of the metal member and the resin according to claim 1, wherein the intermediate layer is the oxide layer.

5. The jointed body of the metal member and the resin according to claim 1, wherein the surface of the metal member is made of copper, nickel, cobalt, zinc, or an alloy thereof.

6. The jointed body of the metal member and the resin according to claim 1, wherein the chelating agent comprises an N-containing group or an S-containing group.

7. The jointed body of the metal member and the resin according to claim 1, wherein the metal member is made of Co, Ni, Fe, Cu, Zn and an alloy thereof or a plated metal.

8. A semiconductor package comprising:
a semiconductor element;
a lead frame electrically connected to the semiconductor element; and
a resin mold adhered to the lead frame,
wherein the lead frame and the resin mold are bonded to a layer in which a silane coupling agent and an intermediate layer of an oxide film made of an oxide of the lead frame and/or a chelating agent are bonded, wherein the silane coupling agent is represented by a structure of $X_{3-n}R_nSi$—$Y$ or $X_{3-n}SiR'SiX_{3-n}$,
where n is 0 or 1; X is selected from a group consisting of a hydrolyzable group OR (R is represented by methyl, ethyl, ethylmethyl, propyl, butyl, isobutyl, s-butyl, t-butyl, and acetyl); X may be the same as or different from each other; Y is selected from a group consisting of organic functional groups represented by amino, mercapto, phenyl, vinyl, epoxy, methacryl, isocyanate, ureide, and sulfur or an alkyl group; R is a methyl group: and R' is one or more groups selected from a group consisting of alkyl, alkenyl, and alkenyl substituted by at least one amino group or S group.

9. The semiconductor package according to claim 8, wherein the surface of the lead frame is covered with a plated metal.

10. The semiconductor package according to claim 8, wherein a metal constituting the lead frame is Co, Ni, Fe, Cu, Zn and an alloy thereof or a plated metal.

11. A semiconductor package in which thickness of the oxide layer described in claim 8 is 100 Å or more and less than 1000 Å.

* * * * *